(12) United States Patent
Gu et al.

(10) Patent No.: US 10,181,565 B2
(45) Date of Patent: Jan. 15, 2019

(54) QUANTUM DOTS COMPOSITE PARTICLES AND THEIR PREPARATION METHOD, PHOTOELECTRIC ELEMENTS AND PHOTOELECTRIC EQUIPMENTS

(71) Applicant: BOE TECHNOLOGY GROUP CO., LTD., Beijing (CN)

(72) Inventors: Jingxia Gu, Beijing (CN); Chen Tang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 267 days.

(21) Appl. No.: 14/429,550

(22) PCT Filed: Jul. 18, 2014

(86) PCT No.: PCT/CN2014/082561
§ 371 (c)(1),
(2) Date: Mar. 19, 2015

(87) PCT Pub. No.: WO2015/058564
PCT Pub. Date: Apr. 30, 2015

(65) Prior Publication Data
US 2016/0020414 A1 Jan. 21, 2016

(30) Foreign Application Priority Data
Oct. 21, 2013 (CN) .......................... 2013 1 0495103

(51) Int. Cl.
| | | |
|---|---|---|
| *B82Y 20/00* | (2011.01) | |
| *B82Y 40/00* | (2011.01) | |
| *H01L 51/00* | (2006.01) | |
| *C09K 11/02* | (2006.01) | |
| *C09K 11/06* | (2006.01) | |
| *C09K 19/54* | (2006.01) | |
| *C09K 11/88* | (2006.01) | |
| *H01L 51/50* | (2006.01) | |
| *H01L 51/56* | (2006.01) | |
| *B82Y 30/00* | (2011.01) | |

(52) U.S. Cl.
CPC ........ *H01L 51/0094* (2013.01); *C09K 11/025* (2013.01); *C09K 11/06* (2013.01); *C09K 11/883* (2013.01); *C09K 19/54* (2013.01); *B82Y 20/00* (2013.01); *B82Y 30/00* (2013.01); *B82Y 40/00* (2013.01); *C09K 2211/10* (2013.01); *H01L 51/502* (2013.01); *H01L 51/5012* (2013.01); *H01L 51/56* (2013.01); *H01L 2251/301* (2013.01); *Y10S 977/774* (2013.01); *Y10S 977/892* (2013.01); *Y10S 977/95* (2013.01)

(58) Field of Classification Search
CPC ......... B82Y 25/00; B82Y 30/00; B82Y 40/20; B82Y 40/00; C09K 11/08
See application file for complete search history.

(56) References Cited

U.S. PATENT DOCUMENTS 7,976,819 B2 * 7/2011 Shih .................. B82Y 5/00
252/301.4 F
2006/0068203 A1 * 3/2006 Ying ................. B82Y 10/00
428/403

FOREIGN PATENT DOCUMENTS

| CN | 1967248 A | 5/2007 |
|---|---|---|
| CN | 101486903 A | 7/2009 |
| CN | 102051177 A | 5/2011 |
| CN | 102851021 A | 1/2013 |
| CN | 102863963 A | 1/2013 |
| CN | 103525398 A | 1/2014 |
| WO | 2011120227 A1 | 10/2011 |

OTHER PUBLICATIONS

Machine translation of CN 102051177.*
Nov. 16, 2015—(CN)—Fifth Office Action Appn 201310495103.5 with English Tran.
May 28, 2015—(CN) Fourth Office Action for Appn 201310495103.5 with Eng Tran.
XianFeng Zhang,et. Al., Bifunctional quantum dot-decorated Ag@SiO2 nanostructures for simultaneous immunoassays of surface-enhanced Raman scattering (SERS) and surface-enhanced fluorescence (SEF), J. Mater. Chem,. B, Mar. 2013, 1, pp. 2198-2204.
Zeng Zhe, Research on fluorescence enhancement based on quantum dots and nanometer metal particles, Master's Theses of the Huazhong University of Science and Technology, Jul. 2013, Abstract, pp. 50-53 and 58.
Sep. 19, 2014—International Search Report for PCT/CN2014/082561—with Eng Tran of Written Opinion.
Lee, et al., "A Nanoreactor Framework of a Au@SiO2 Yolk/Shell Structure for Catalytic Reduction of p-Nitrophenol", Advanced Materials 2008, 20 1523-1528, 20078 Wiley-Vch Veriag GmbH & Co. KGaA, Weinheim.
Zong Shenfei, et al., "A Dual-Mode Cell Imaging Probe Based on Silica Coated Gold Namoronds", Sciencepaper Online, Oct. 23, 2012, pp. 1-8, Advanced Photonics Center, Southeast University, Nanjing 210096, <http://www.paper.edu.cn>.
Jun. 20, 2014—(CN) First Office Action of Application No. 201310495103.5 with Eng Tran.
Oct. 16, 2014—(CN) Second Office Action of Application No. 201310495103.5 with Eng Tran.
Jan. 21, 2015—(CN) Third Office Action of Application No. 201310495103.5 with Eng Tran.

* cited by examiner

*Primary Examiner* — Haidung D Nguyen
(74) *Attorney, Agent, or Firm* — Banner & Witcoff, Ltd.

(57) ABSTRACT

The invention refers to quantum dots (QDs) composite particles and their preparation method, photoelectric elements and photoelectric equipment. The preparation method of QDs composite particles comprises: coating the surface of metal nanoparticles (MNPs) with silica; modifying the silica coated MNPs through amination to make the surface of the silica have amino functional groups; and combining the carboxyl-functionalized QDs with amino-functionalized silica coated MNPs, thereby preparing the QDs composite particles. The preparation method can enhance the fluorescent efficiency of QDs.

11 Claims, 2 Drawing Sheets

QUANTUM DOTS COMPOSITE PARTICLES AND THEIR PREPARATION METHOD, PHOTOELECTRIC ELEMENTS AND PHOTOELECTRIC EQUIPMENTS

The application is a U.S. National Phase Entry of International Application No. PCT/CN2014/082561 filed on Jul. 18, 2014, designating the United States of America and claiming priority to Chinese Patent Application No. 201310495103.5 filed on Oct. 21, 2013. The present application claims priority to and the benefit of the above-identified applications and the above-identified applications are incorporated by reference herein in their entirety.

TECHNICAL FIELD

The embodiments of the invention are related to quantum dots (QDs) composite particles and their preparation method, photoelectric elements and photoelectric equipments.

BACKGROUND

QDs, also known as semiconductor nanocrystals, are a new type of fluorescent nanomaterials. Compared with conventional organic fluorescent dyes, QDs have many advantages such as wider excitation spectra, narrower and symmetric emission spectra, and higher fluorescent intensity. These advantages of QDs have attracted very important application in the display field. However, in the practical application, the emission efficiency of QDs, especially blue-emitting QDs, is quite low.

SUMMARY

The embodiments of the invention provide a type of QDs composite particles and their preparation method, photoelectric elements and photoelectric equipments, which significantly improve the fluorescent efficiency of QDs.

At least one embodiment of the invention provides a preparation method for QDs composite particles, including coating surface of metal nanoparticles (MNPs) with silica; modifying the silica-coated MNPs through amination to make the surface of the silica have amino functional groups; and combining QDs having carboxyl-functionalized surface with the amino-functionalized silica-coated MNPs to prepare the QDs composite particles.

At least one embodiment of the invention provides QDs composite particles, comprising MNPs, silica with which the surface of the MNPs is coated wherein the silica has amino functional groups, and carboxyl-functionalized QDs combined with the silica.

At least one embodiment of the invention provides a photoelectric element comprising the above-mentioned QDs composite particles.

At least one embodiment of the invention provides a photoelectric equipment comprising the above-mentioned photoelectric element.

BRIEF DESCRIPTION OF THE DRAWINGS

In order to illustrate the technical solutions of the embodiments of the present invention more clearly, the brief introduction will be made below to the accompanying drawings of these embodiments. Obviously, the drawings described below only relates to certain embodiments of the invention, rather than limitation on the invention.

REFERENCE SIGNS

11—metal NPs, 12—silica, and 13—QDs.

DETAILED DESCRIPTION

In order to further clarify the purposes, technical solutions and advantages of the embodiments of the present invention, clear and complete description will be made to the technical solutions of the embodiments of the invention below with reference to the drawings of the embodiments of the invention. Obviously, the described embodiments are only a part of the embodiments of the invention, not all the embodiments. Based on the described embodiments of the invention, all the other embodiments obtainable by those skilled in the art without inventive work shall fall within the scope of the invention.

Figure 1:
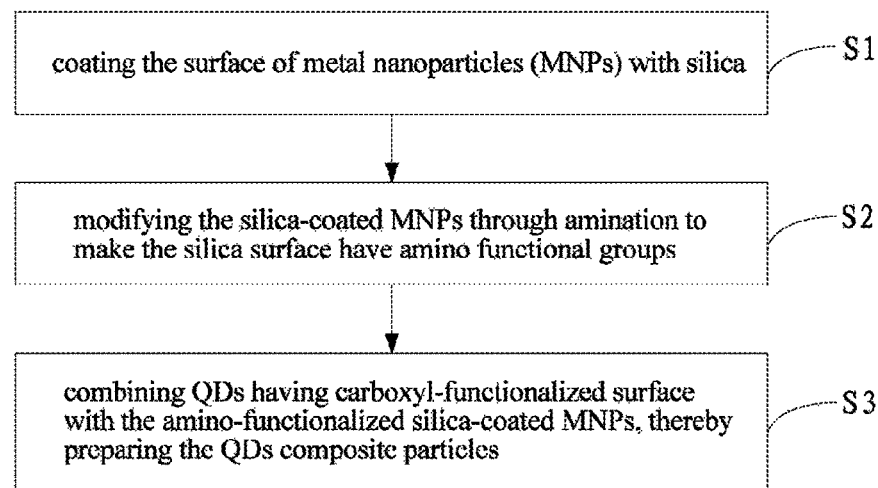
FIG. 1 shows a schematic flowchart of a method for preparing QDs composite particles according to an embodiment of the invention.

At least one embodiment of the invention provides a preparation method of QDs composite particles, as shown by FIG. 1, and the method comprises the steps of:

S1. Coating the surface of MNPs with silica.

In at least one embodiment of the invention, coating the surface of MNPs with silica may be performed using a sol-gel method.

S2. Modifying the silica-coated MNPs through amination to make the silica surface have amino functional groups.

In at least one embodiment of the invention, a coupling agent with amino group(s) may be used for the modification of the silica-coated MNPs through amination to make the silica surface have amino functional groups.

For example, the coupling agent with amino group(s) may be an aminosilane couping agent. The aminosilane couping agent includes at least one of mono-, bis-, and tris-aminosilanes. For example, the aminosilane couping agent may be mono-amino silane coupling agent alone or a mixture of mono- and bis-aminosilanes.

S3. Combining QDs having carboxyl-functionalized surface with the amino-functionalized silica-coated MNPs to prepare the QDs composite particles.

In at least one embodiment of the invention, EDC (1-(3-dimethylamino propyl)-3-ethyl carbodiimide hydrochloride) may be used to combine QDs having carboxyl-functionalized surface with the amino-functionalized silica-coated MNPs through chemical coupling, thereby preparing the QDs composite particles.

EDC is a water-soluble carbodiimide, which can be used as an activating agent of the carboxyl groups in the synthesis of amide. Efficiency of the coupling between QDs having carboxyl-functionalized surface and the amino-functionalized silica can be improved by EDC.

The QDs include NPs of compounds of II-VI Group or compounds of III-V Group. NPs of compounds of II-VI Group are semiconductor of compounds of Group II (Zn, Cd, Hg) and Group VI (S, Se, Te). The formula of compounds of II-VI Group is A(II)B(VI), such as ZnS, ZnSe, ZnTe, CdS, CdSe, CdTe, HgS, HgSe and HgTe; NPs of compounds of III-V Group are semiconductor of compounds of Group III (B, Al, Ga, In) and Group V (N, P, As, Sb). The formula of compounds of III-V Group is A(III)B(V), such as BN, BP, BAs, BSb, AlN, AlP, AlAs, AlSb, GaN, GaP, GaAs, GaSb, InAs, InN, InP and InSb. The QDs may be any one of the above-mentioned QDs.

QDs having carboxyl-functionalized surface can be prepared by means of the existing processes, one of which employs polyphosphates or mercapto compounds as a stabilizer to prepare QDs via aqueous phase direct synthesis. For example, QDs having carboxyl-functionalized surface can be prepared by the reaction between $Cd^{2+}$ and a compound containing Se or Te in an aqueous solution with polyphosphates or mercapto compounds as a stabilizer. QDs having carboxyl-functionalized surface can also be purchased (for example CdS QDs, trade name JNS-QD04-550, Nanjing Janus New-Materials Co. Ltd.).

In at least one embodiment of the invention, the MNPs include Ag NPs, Au NPs, Cu NPs, Al NPs, Zn NPs, Cr NPs or Pt NPs, or the combination thereof. Plasmon resonance inside the MNPs may significantly enhance the fluorescence intensity of fluorescent materials near their surface, which is known as metal enhanced fluorescence. When metal nanoparticles exist within the range of the radiation energy of fluorescent materials, the resonance energy transfer can be enhanced due to changing the fluorescence decay ratio of the radiation medium around MNPs by their plasmon-resonance electromagnetic field. Thus when the fluorescent materials are placed in a desired distance from metal nanoparticles, the total radiative decay ratio of the fluorescent materials increases due to the presence of the MNPs, which improves the fluorescent quantum yield and significantly enhances the fluorescent intensity.

In an embodiment of the invention, selection of the MNPs mainly depends on the light emitting region of the fluorescent materials on the surface of the MNPs or near the MNPs. For example, Ag NPs, Au NPs, or Cu NPs are generally used to enhance the fluorescent intensity of fluorescent molecules in the visible-to-near-infrared region; Al NPs in the ultraviolet-to-blue region; Zn NPs in the blue-to-red region; Cr NPs in the range between 510 nm and 620 nm; and Pt NPs in the green-to-red region.

In at least one embodiment of the invention, there is a certain distance between the QDs and the MNPs due to the silica coating on the surface of the MNPs. The MNPs exist within the range of the radiative energy of the QDs, and thus the plasmon resonance inside the MNPs may enhance the fluorescent intensity of the QDs and greatly improve the fluorescent efficiency of the QDs.

In at least one embodiment of the invention, the thickness of the silica coating on the surface of the MNPs can be from 5 to 20 nm; for example, when the thickness of the silica coating on the surface of the MNPs can be from 10 to 15 nm, the fluorescent efficiency of the QDs composite particles prepared increases by 120%-180%. The experiments have showed that when the thickness of the silica coating on the surface of the MNPs is about 10 nm, the fluorescent efficiency of prepared QDs composite particles prepared is the best, which increases by 180%.

In at least one embodiment of the invention, the emission wavelength of the QDs is 452-670 nm, which is referred to as blue-emitting QDs, such as ZnS, CdZnS, and CdSe. As is known in the art, the fluorescent efficiency of blue-emitting QDs is generally quite poor. Nevertheless, the preparation method provided by the embodiments of the invention can significantly enhance the fluorescent efficiency of the blue-emitting QDs.

Blue light is a visible light, and the fluorescent efficiency of blue-emitting QDs can be enhanced by selecting MNPs such as Ag NPs, Au NPs, Cu NPs, Al NPs and Zn NPs. Further description will be made below using Ag-NPs-enhanced blue-emitting CdSe as an example, and the following is only to illustrate an embodiment of the invention, rather than a limitation on the invention.

Step 1. Coating the surface of Ag NPs with silica 30 mL of Ag NPs aqueous solution was placed in a 250 mL round-bottom flask and 100 mL of ethanol was added with thoroughly stirring at room temperature until obtaining a uniform mixture. After 2 mL of ammonia was added, 3 mL of 100 mM TEOS in ethanol was added in 6 aliquots into the flask every 20 min, so as to ensure the uniform size of the resulting silica-coated Ag NPs. Stirring was continued for 8 hours to finish the reaction, thus obtaining silica-coated Ag NPs.

Step 2. Functionalizing the surface of the silica with amino groups 20 mL of the silica-coated Ag NPs solution obtained from the step 1 was added into a 50 mL round-bottom flask with vigorous stirring. Then 200 μL of aminosilane coupling agent was added into the solution and stirred for 12 hours at room temperature to obtain silica-coated Ag NPs having amino groups on the surface.

Step 3. Preparing the QDs composite particles 6 mL of the aqueous solution of the silica-coated Ag NPs having amino groups on the surface was added into a 50 mL round-bottom flask with vigorous stirring. Ammonia solution was added until the pH of the solution reached 7.0, and then 150 μL of 0.2 M phosphate buffer solution (PBS) was added into the solution to stabilize pH. Then 100 μL of a solution containing blue-emitting QDs having carboxyl groups on the surface and $3\times10^{-5}$ g EDC was added. The reaction was continued for 30 minutes at room temperature, thereby obtaining the QDs composite particles provided by the invention, of which the fluorescent efficiency was enhanced by Ag NPs.

Figure 2:
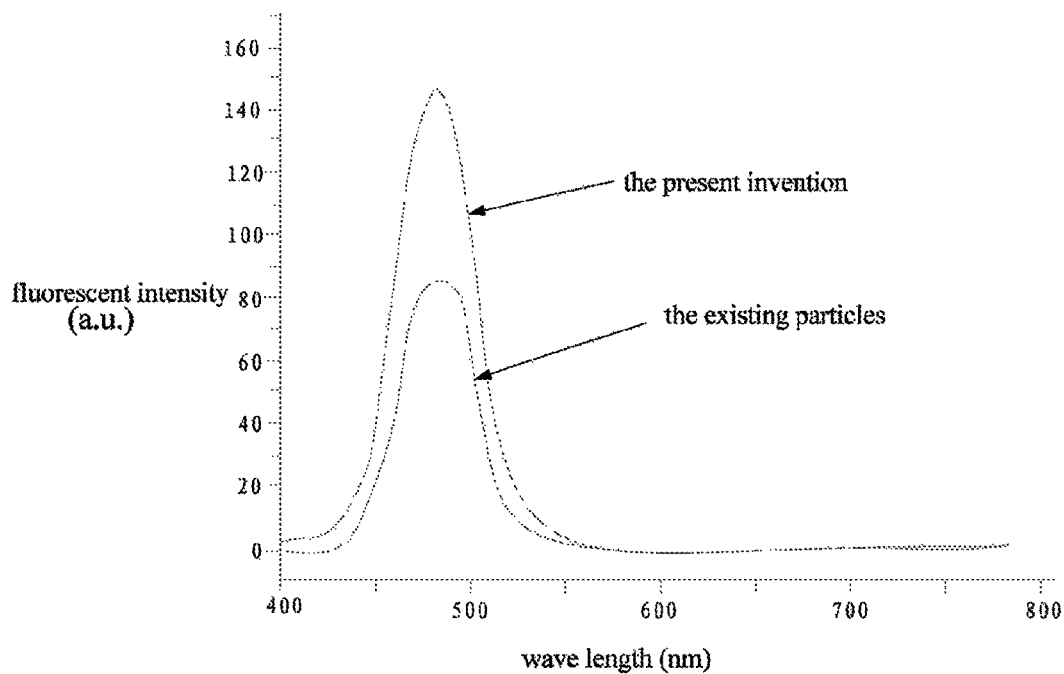
FIG. 2 compares the photoluminescent spectrum of blue-emitting QDs with the photoluminescent spectrum of the blue-emitting QDs composite particles whose fluorescent efficiency is enhanced by Ag NPs according to an embodiment of the invention.

FIG. 2 shows the comparison between the photoluminescent spectrum of the blue-emitting QDs composite particles whose fluorescent efficiency is enhanced by Ag NPs according to an embodiment of the present invention with that of the blue-emitting QDs. As shown by FIG. 2, under irradiation of a light at the same wavelength, the fluorescent intensity of the blue-emitting QDs composite particles prepared by the embodiment of the invention is higher, i.e. their fluorescent efficiency is higher.

Figure 3:
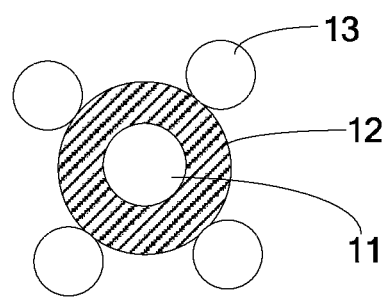
FIG. 3 is a schematic illustration of QDs composite particles provided by an embodiment of the invention.

At least one embodiment of the invention also provided a kind of QDs composite particles prepared by the above method, which, as shown in FIG. 3, included MNPs 11; silica 12 with which the surface of MNPs 11 was coated; and QDs 13 combined with the silica 12.

For example, the thickness of the silica was from 5 to 20 nm. For example, the thickness of the silica was from 10 to 15 nm.

At least one embodiment of the invention also provided a photoelectric element comprising the above QDs composite particles. The photoelectric element may be QDs films, colorful films, backlight, polarizer, light emitting layer or photoelectric conversion device, etc.

At least one embodiment of the invention also provided a photoelectric equipment comprising the above photoelectric element using QDs composite particles. The photoelectric equipment can be any product or member with lighting function or display function such as lighting equipment, liquid crystal display (LCD) panel, electronic paper, organic electroluminesence display (OLED) panel, cell phones, Flat PC, television, display device, laptop computer, digital photo frame and navigation device.

For example, the QDs composite particles can have electroluminescent performance, which can be used to make photoelectric conversion device.

In other words, the above QDs composite particles can be used to prepare QDs film as well as colorful film or backlight in the LCD device; for example, blue-emitting QDs composite particles can be used to prepare blue colorful film. Red-emitting and green-emitting QDs composite particles can be also used to prepare red colorful film and green colorful film, respectively. Alternatively, QDs composite particles can be used to form white light as light source in the backlight of the LCD device.

For example, the above QDs composite particles can be also used to prepare the light emitting layer in the OLED device, and a light emitting layer which emits red, green, or blue light can be prepared from the QDs composite particles.

Alternatively, the above QDs composite particles can be also used to prepare the lighting equipment. QDs composite particles with various emissions may be doped to prepare white-emittting materials for lighting.

The above are only exemplary embodiments of the invention, and are not intended to limit the scope of the invention, which is defined by the accompanying claims.

The present application claims the benefits of Chinese patent application No. 201310495103.5 filed on Oct. 21, 2013, which is incorporated herein by reference in its entirety.

The invention claimed is:

1. A preparation method of quantum dots (QDs) composite particles, comprising:
    coating the surface of metal nanoparticles (MNPs) with silica;
    modifying the silica-coated MNPs through amination to make the silica surface have amino functional groups; and
    combining QDs having carboxyl-functionalized surface with the amino-functionalized silica-coated MNPs, thereby preparing the QDs composite particles,
    wherein QDs having carboxyl-functionalized surface are prepared via aqueous phase direct synthesis employing polyphosphates or mercapto compounds as a stabilizer;
    the MNPs are selected from the group consisting of Al nanoparticles, Zn nanoparticles, Cr nanoparticles and Pt nanoparticles; and
    the thickness of the silica is from 10 to 15 nm.

2. The preparation method according to claim 1, wherein coating the surface of MNPs with silica is performed using a sol-gel method.

3. The preparation method according to claim 2, wherein a coupling agent with amino group(s) is used for the modification of the silica-coated MNPs through amination, so as to make the silica surface have amino functional groups.

4. The preparation method according to claim 3, wherein 1-(3-dimethylamino propyl)-3-ethyl carbodiimide hydrochloride is used to combine QDs having carboxyl-functionalized surface with the amino-functionalized silica-coated MNPs through chemical coupling, thereby preparing the QDs composite particles.

5. The preparation method according to claim 3, wherein the coupling agent with amino group(s) includes an aminosilane couping agent;
    wherein the aminosilane couping agent includes at least one of mono-, bis-, and tris-aminosilanes.

6. The preparation method according to claim 2, wherein 1-(3-dimethylamino propyl)-3-ethyl carbodiimide hydrochloride is used to combine QDs having carboxyl-functionalized surface with the amino-functionalized silica-coated MNPs through chemical coupling, thereby preparing the QDs composite particles.

7. The preparation method according to claim 1 wherein a coupling agent with amino group(s) is used for the modification of the silica-coated MNPs through amination, so as to make the silica surface have amino functional groups.

8. The preparation method according to claim 7, wherein 1-(3-dimethylamino propyl)-3-ethyl carbodiimide hydrochloride is used to combine QDs having carboxyl-functionalized surface with the amino-functionalized silica-coated MNPs through chemical coupling, thereby preparing the QDs composite particles.

9. The preparation method according to claim 7, wherein the coupling agent with amino group(s) includes an aminosilane couping agent;
    wherein the aminosilane couping agent includes at least one of mono-, bis-, and tris-aminosilanes.

10. The preparation method according to claim 1, wherein 1-(3-dimethylamino propyl)-3-ethyl carbodiimide hydrochloride is used to combine QDs having carboxyl-functionalized surface with the amino-functionalized silica-coated MNPs through chemical coupling, thereby preparing the QDs composite particles.

11. The preparation method according to claim 1, wherein the QDs include compounds of II-VI Group or compounds of III-V Group.

* * * * *